(12) United States Patent
Yokoyama et al.

(10) Patent No.: US 10,117,363 B2
(45) Date of Patent: Oct. 30, 2018

(54) MANAGEMENT OF SERVER DEVICE, SERVER CONTROL METHOD, AND PROGRAM BY TEMPERATURE

(71) Applicant: NEC Corporation, Tokyo (JP)

(72) Inventors: Jun Yokoyama, Tokyo (JP); Kazuya Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 37 days.

(21) Appl. No.: 15/463,062

(22) Filed: Mar. 20, 2017

(65) Prior Publication Data

US 2017/0277236 A1   Sep. 28, 2017

(30) Foreign Application Priority Data

Mar. 23, 2016 (JP) .................................. 2016-058320

(51) Int. Cl.
| | | |
|---|---|---|
| *H05K 7/20* | (2006.01) | |
| *G06F 1/20* | (2006.01) | |
| *H05K 7/14* | (2006.01) | |
| *G06F 11/30* | (2006.01) | |

(52) U.S. Cl.
CPC ......... *H05K 7/20836* (2013.01); *G06F 1/206* (2013.01); *G06F 11/3044* (2013.01); *G06F 11/3058* (2013.01); *H05K 7/1488* (2013.01); *H05K 7/20172* (2013.01); *H05K 7/20727* (2013.01); *H05K 7/20772* (2013.01); *H05K 7/20781* (2013.01)

(58) Field of Classification Search
CPC ............. H05K 7/1488; H05K 7/20263; H05K 7/20727; H05K 7/20772; H05K 7/20781; H05K 7/20836; G06F 1/20; G06F 1/206; G06F 11/3044; G06F 11/3058
See application file for complete search history.

(56) References Cited

U.S. PATENT DOCUMENTS

| | | | | |
|---|---|---|---|---|
| 6,826,456 B1 * | 11/2004 | Irving | ...................... | G06F 1/20 |
| | | | | 361/695 |
| 7,263,620 B2 * | 8/2007 | Bresniker | ................ | G06F 1/18 |
| | | | | 340/540 |
| 8,248,793 B2 * | 8/2012 | Bash | .................. | H05K 7/20609 |
| | | | | 312/236 |

(Continued)

FOREIGN PATENT DOCUMENTS

| JP | 2007-179437 A | 7/2007 |
|---|---|---|
| JP | 2011-018131 A | 1/2011 |

(Continued)

OTHER PUBLICATIONS

Japanese Office Action corresponding to JP2016-058320, dated Feb. 28, 2017, 10 pp.

*Primary Examiner* — Crystal J Barnes-Bullock
(74) *Attorney, Agent, or Firm* — Wilmer Cutler Pickering Hale and Dorr LLP (57) ABSTRACT

A server device having a plurality of server modules and a plurality of cooling fans in a chassis includes: a management unit configured to control the server modules; and a temperature measurement part configured to perform measurement of temperatures of the server modules. The management unit is configured to decide a server module to run on a basis of a result of the measurement by the temperature measurement part.

8 Claims, 7 Drawing Sheets

(56) References Cited

U.S. PATENT DOCUMENTS

| | | | | |
|---|---|---|---|---|
| 9,351,430 B2* | 5/2016 | James | ............... | H05K 7/20781 |
| 9,420,726 B2* | 8/2016 | Kodama | ............ | H05K 7/20745 |
| 9,785,208 B2* | 10/2017 | Lovicott | ................ | G06F 1/206 |
| 9,918,411 B2* | 3/2018 | Rinke | ................ | H05K 7/20727 |
| 2010/0217454 A1 | 8/2010 | Spiers et al. | | |
| 2013/0166092 A1* | 6/2013 | Wang | ................ | G06F 11/3044 |
| | | | | 700/299 |
| 2016/0345469 A1* | 11/2016 | Begolli | ................ | F04D 17/16 |

FOREIGN PATENT DOCUMENTS

| | | |
|---|---|---|
| JP | 2013-029915 A | 2/2013 |
| JP | 2013-037439 A | 2/2013 |

\* cited by examiner

| | FAN | SERVER MODULE | | | SWITCH MODULE | POWER SUPPLY DEVICE |
|---|---|---|---|---|---|---|
| 1 | 3-1 3-2 | 2-3 | 2-2 | 2-1 | 41-1 | - |
| | | 2-6 | 2-5 | 2-4 | | |
| 2 | 3-3 3-4 | 2-9 | 2-8 | 2-7 | | - |
| | | 2-12 | 2-11 | 2-10 | | |
| 3 | 3-5 3-6 | 2-14 | 2-13 | - | 41-2 | - |
| | | 2-16 | 2-15 | - | | |
| 4 | 3-7 3-8 | 2-18 | 2-17 | - | | ○ |
| | | 2-20 | 2-19 | - | | |

MANAGEMENT OF SERVER DEVICE, SERVER CONTROL METHOD, AND PROGRAM BY TEMPERATURE

INCORPORATION BY REFERENCE

This application is based upon and claims the benefit of priority from Japanese patent application No. 2016-058320, filed on Mar. 23, 2016, the disclosure of which is incorporated herein in its entirety by reference.

TECHNICAL FIELD

The present invention relates to a server device, a server control method, and a program. More specifically, the present invention relates to a server device which executes control in consideration of the life of the device, a server control method, and a program.

BACKGROUND ART

A server device is known which stores a plurality of server modules in a chassis and controls the temperature in the chassis with a built-in fan.

For example, Patent Document 1 discloses an enclosure control device which has a power supply control part, a cooling fan control part, and a blade unit control part. According to Patent Document 1, the blade unit control part decides a blade server (a server module) to be subjected to power supply control so that power supplied to a cooling fan (a fan) becomes the least. To be specific, the blade unit control part calculates power supplied to a cooling fan unit of each blade server assuming the blade server is turned on. Then, the blade unit control part decides a blade server to turn on so that power supplied to the cooling fan unit becomes the least on the basis of the result of calculation. According to Patent Document 1, such a configuration allows a cooling fan for cooling a blade server to efficiently run.

Patent Document 1: Japanese Unexamined Patent Application Publication No. JP-A 2013-029915

In the case of the technique disclosed in Patent Document 1, a blade server to turn on is decided on the basis of power supplied to the cooling fan. Therefore, according to Patent Document 1, there is a fear that even if the temperature around a blade server is not necessarily appropriate to run the blade server (for example, the temperature is high), the blade server is decided as a blade server to turn on. As a result, there arises a problem that a failure rate may increase, for example. In other words, there arises a problem that in a server device, execution of control in consideration of the life of the server device is difficult.

SUMMARY OF THE INVENTION

Accordingly, an object of the present invention is to provide a server device which solves a problem that in a server device having a plurality of server modules, execution of control in consideration of the life of the server device is difficult.

In order to achieve the object, a server device as an aspect of the present invention is a server device having a plurality of server modules and a plurality of cooling fans in a chassis, and the server device includes:

a management unit configured to control the server modules; and a temperature measurement part configured to perform measurement of temperatures of the server modules.

The management unit is configured to decide a server module to run on a basis of a result of the measurement by the temperature measurement part.

Further, a server control method as another aspect of the present invention is a server control method executed by a server device having a plurality of server modules and a plurality of cooling fans in a chassis, and the server control method includes performing measurement of temperatures of the server modules and deciding a server module to run on a basis of a result of the measurement.

Further, a program as another aspect of the present invention is a program including instructions for causing a server device to realize a management unit, the server device has a plurality of server modules and a plurality of cooling fans in a chassis and also has a temperature measurement part configured to perform measurement of temperatures of the server modules, and the management unit is configured to control the server modules.

The management unit is configured to decide a server module to run on a basis of a result of the measurement by the temperature measurement part.

With the configurations as described above, the present invention can provide a server device which solves the problem that in a server device having a plurality of server modules, execution of control in consideration of the life of the server device is difficult.

EXEMPLARY EMBODIMENT

First Exemplary Embodiment

Figure 1:
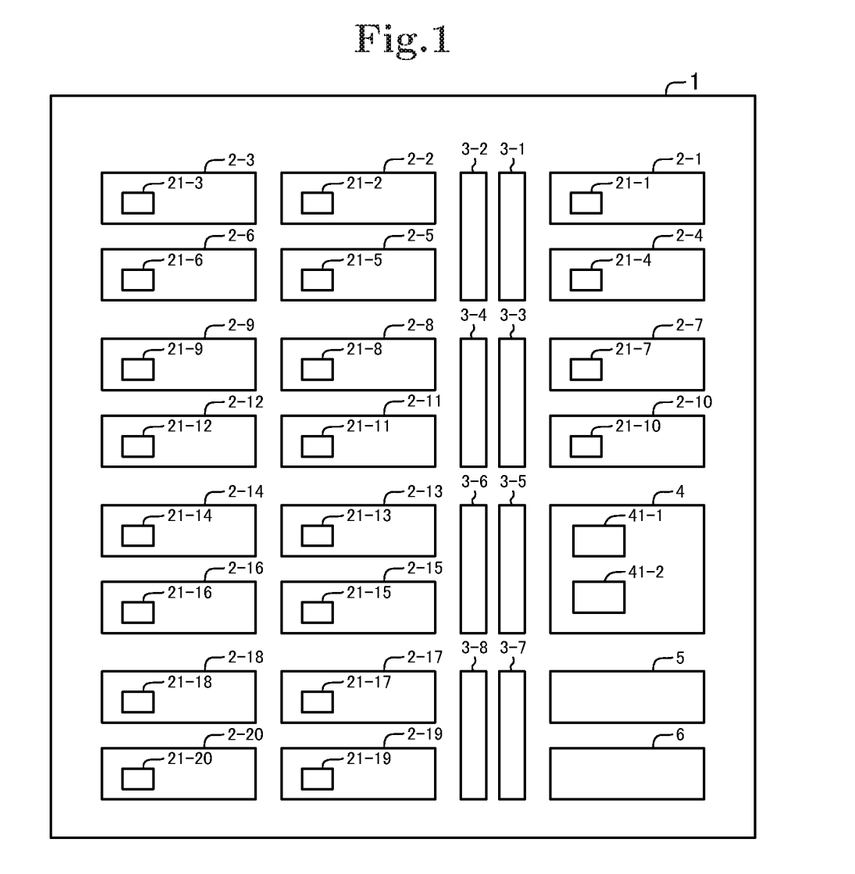
FIG. 1 is a block diagram showing an example of the configuration of a server device according to a first exemplary embodiment of the present invention.
Figure 2:
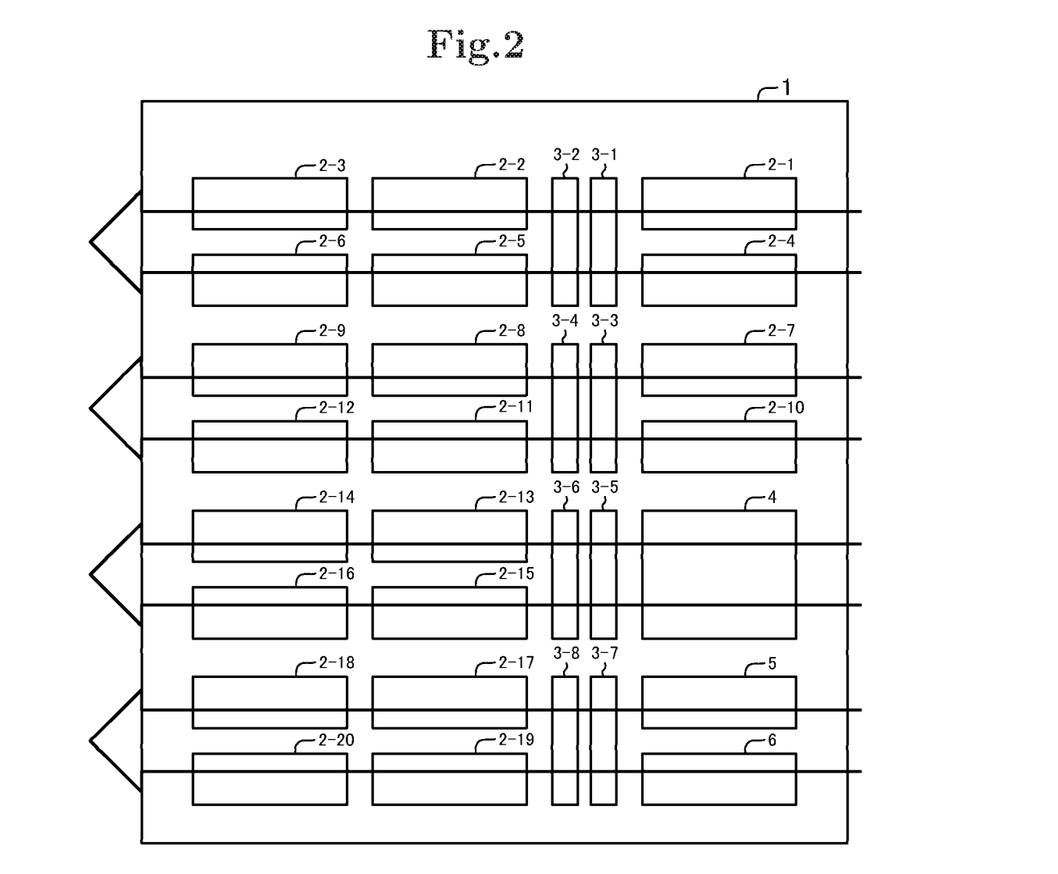
FIG. 2 is a diagram showing an example of an airflow caused by a fan shown in FIG. 1.
Figure 3:
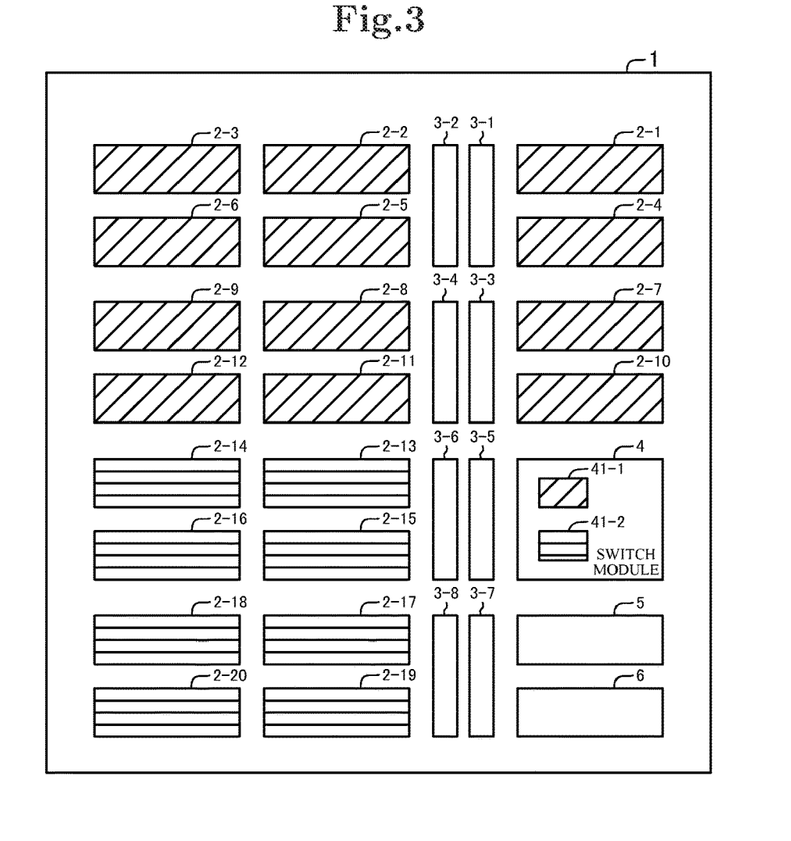
FIG. 3 is a diagram showing an example of the connection relation between a server module and a switch module shown in FIG. 1.
Figure 4:
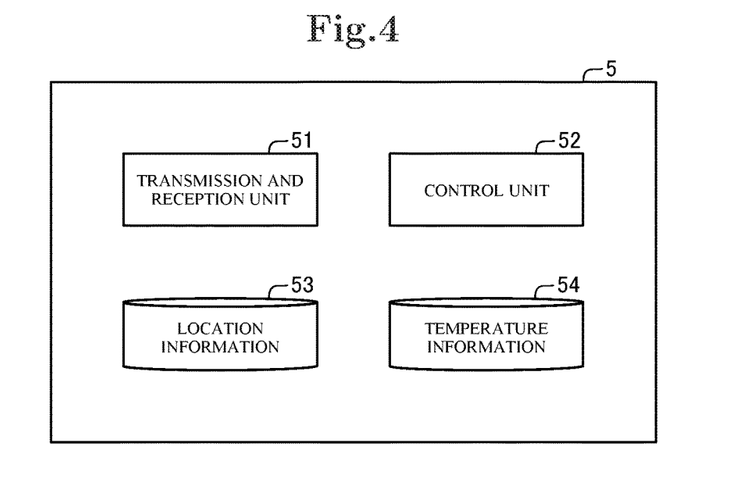
FIG. 4 is a block diagram showing an example of the configuration of a chassis management module shown in FIG. 1.
Figure 5:
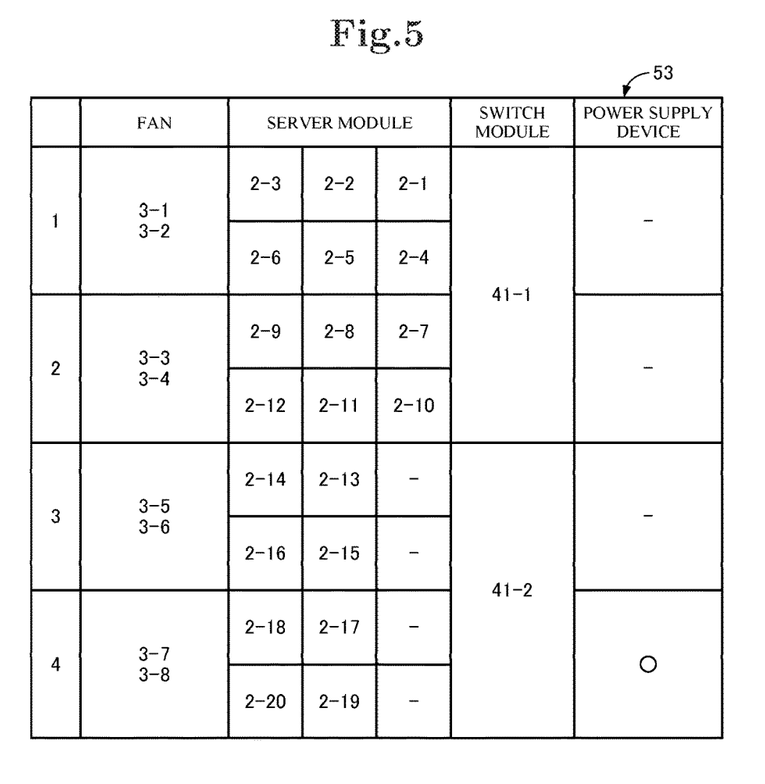
FIG. 5 is a diagram showing an example of location information shown in FIG. 4.
Figure 6:
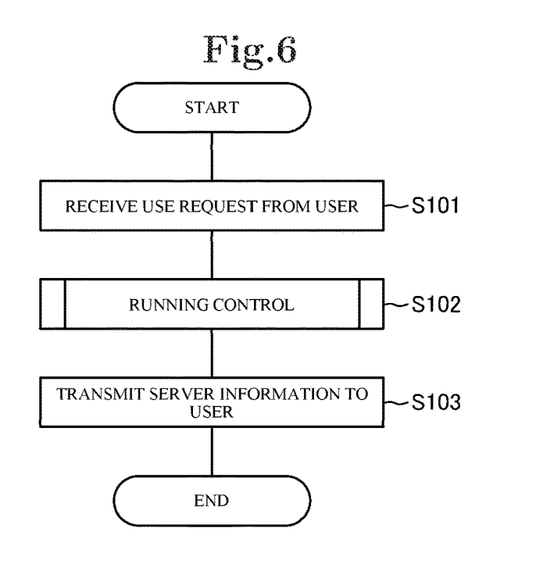
FIG. 6 is a flowchart showing an example of the operation of the server device according to the first exemplary embodiment of the present invention.
Figure 7:
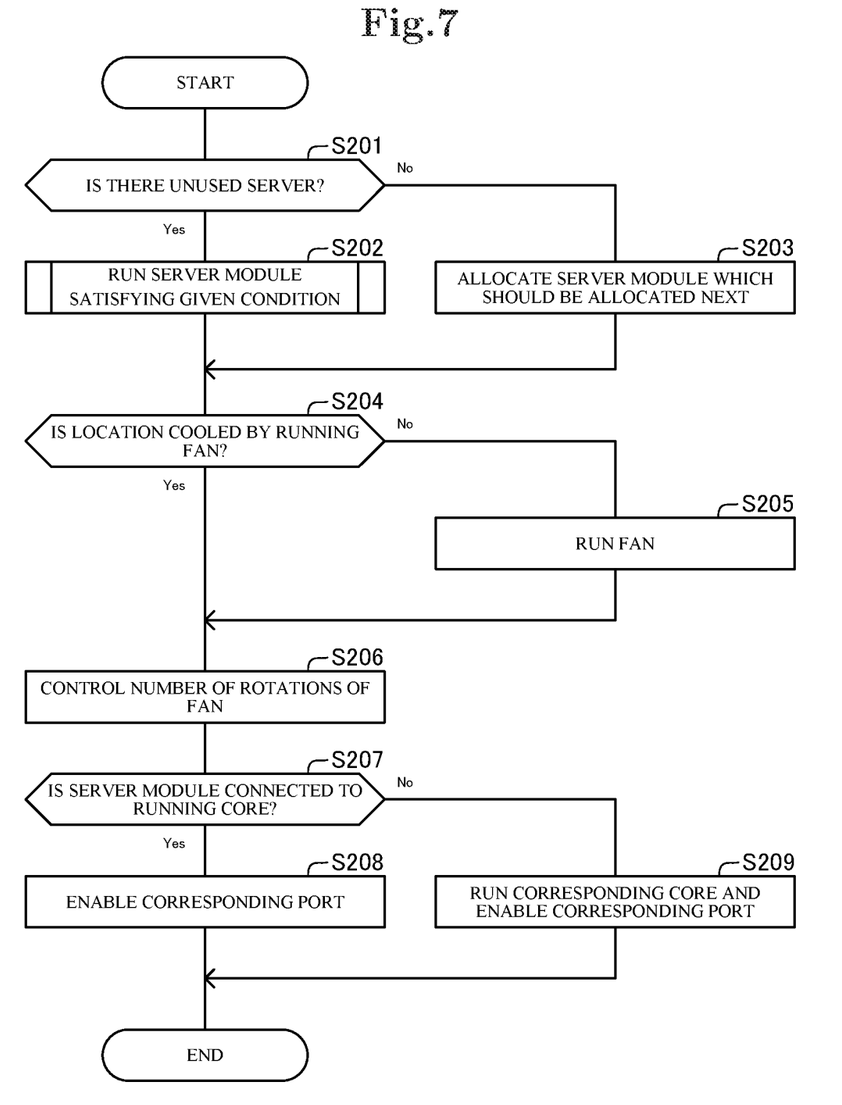
FIG. 7 is a flowchart showing an example of the flow of running control executed by the server device according to the first exemplary embodiment of the present invention.
Figure 8:
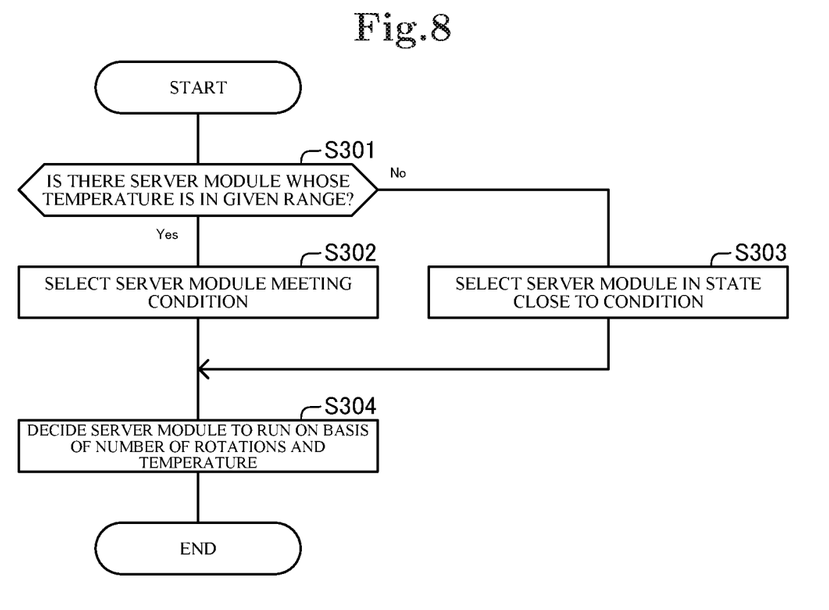
FIG. 8 is a flowchart showing an example of the flow of a server module allocation process executed by the server device according to the first exemplary embodiment of the present invention.
Figure 9:
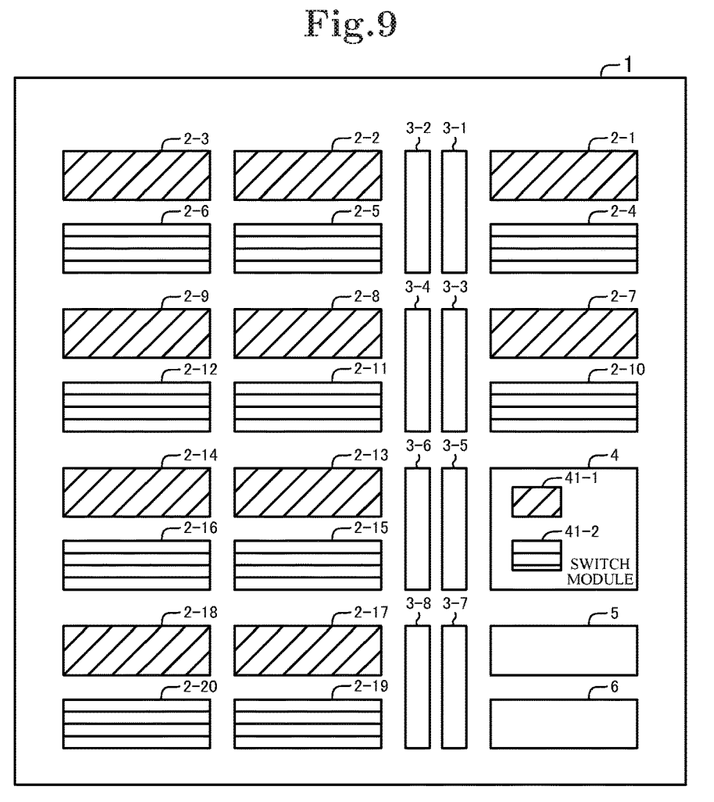
FIG. 9 is a diagram showing another example of the connection relation between the server module and the switch module shown in FIG. 1.

A first exemplary embodiment of the present invention will be described with reference to FIGS. 1 to 9. FIG. 1 is a block diagram showing an example of the configuration of a server device 1. FIG. 2 is a diagram showing an example of an airflow caused by a fan 3. FIG. 3 is a diagram showing an example of the connection relation between a server module 2 and a switch module 4. FIG. 4 is a block diagram showing an example of the configuration of a chassis management module 5. FIG. 5 is a diagram showing an example of location information 53. FIG. 6 is a flowchart showing an example of the operation of the server device 1. FIG. 7 is a flowchart showing an example of the flow of running control executed by the server device 1. FIG. 8 is a flowchart showing an example of the flow of a server module allocation process executed by the server device 1. FIG. 9 is a diagram showing another example of the connection relation between the server module 2 and the switch module 4.

In the first exemplary embodiment of the present invention, the server device 1 having a plurality of server modules 2 and a plurality of fans 3 (cooling fans) in a chassis will be described. The server modules 2 and the fans 3 in this exemplary embodiment can be placed in predetermined positions in the server device 1. As described later, the chassis management module 5 controlling the server modules 2 and the fans 3 decides the server module 2 to run on the basis of, for example, the temperatures of the server modules 2.

The server device 1 is a server device such as a micro modular server. Referring to FIG. 1, the server device 1 has a plurality of server modules 2 (2-1, 2-2 . . . 2-20; expressed as the server modules 2 when they are not distinguished from each other specifically).

Each of the server modules 2 has a temperature measurement part 21 (21-1, 21-2 . . . 21-20; expressed as the temperature measurement parts 21 when they are not distinguished from each other specifically) which measures the temperature of the server module 2. For example, the server module 2-1 has the temperature measurement part 21-1 and causes the temperature measurement part 21-1 to measure the temperature of the server module 2-1. Likewise, the server modules 2-2 to 2-20 have the temperature measurement parts 21-2 to 21-20, respectively. The temperature measurement part 21 measures the temperature of the server module 2 and transmits the measurement result to the chassis management module 5 to be described later.

Further, the server device 1 has a plurality of fans 3 (3-1, 3-2 . . . 3-8; expressed as the fans 3 when they are not distinguished from each other specifically). Moreover, the server device 1 has a switch module 4, the chassis management module 5 (a management unit), and a power supply device 6.

As described above, in the server device 1 in this exemplary embodiment, the server modules 2 and the fans 3 can be placed in predetermined positions. For example, the server modules 2 and the fans 3 are tightly and regularly placed in the server device 1.

To be specific, for example, referring to FIG. 1, the server device 1 includes: the fans 3 arranged in four rows and two columns; and the server modules 2 placed in one column on one side from the fans 3 (for example, on a side where the power supply device 6 is provided) and in two columns on the other side. In other words, the fans 3 are arranged so as to be sandwiched by the server modules 2 in the server device 1. For example, in the case of FIG. 1, the server module 2-3, the server module 2-2, the fan 3-2, the fain 3-1, and the server module 2-1 are placed in this order from the left side to the right side of FIG. 1.

Further, in the server device 1, the server modules 2 of two rows are placed for one fan 3 (the fans 3 of one row). For example, in the case of FIG. 1, the server module 2-3, the server module 2-2, the fan 3-2, the fain 3-1, and the server module 2-1 are placed in the abovementioned order, and also, the server module 2-6, the server module 2-5, the fan 3-2, the fan 3-1 and the server module 2-4 are placed from the left side to the right side in FIG. 1. That is to say, the server modules 2-1 and 2-4 of one column are placed on one side from the fans 3-2 and 3-1, whereas the server modules 2 of two columns, namely, the server modules 2-3 and 2-6 in one column and the server modules 2-2 and 2-5 in another one column are placed on the other side.

Also with respect to the fans 3-4 and 3-3, the server modules 2 are placed as with respect to the fans 3-2 and 3-1. That is to say, the server module 2-9, the server module 2-8, the fan 3-4, the fan 3-3 and the server module 2-7 are placed in order from the left side in FIG. 1. Likewise, the server module 2-12, the server module 2-11, the fan 3-4, the fan 3-3 and the server module 2-10 are placed.

Further, with respect to the fans 3-6 and 3-5, the switch module 4 is placed on one side, and the server modules 2 are placed on the other side (on a side where the server modules 2 of two rows are placed). For example, in the case of FIG. 1, the server module 2-14, the server module 2-13, the fan 3-6, the fan 3-5 and the switch module 4 are placed in order from the left side in FIG. 1. Likewise, the server module 2-16, the server module 2-15, the fan 3-6, the fan 3-5 and the switch module 4 are placed.

Further, with respect to the fans 3-8 and 3-7, the chassis management module 5 and the power supply device 6 are placed on one side, and the server modules 2 are placed on the other side (on a side where the server modules 2 of two rows are placed). For example, in the case of FIG. 1, the server module 2-18, the server module 2-17, the fan 3-8, the fan 3-7 and the chassis management module 5 are placed in order from the left side in FIG. 1. Moreover, the server module 2-20, the server module 2-19, the fan 3-8, the fan 3-7 and the power supply device 6 are placed in order from the left side in FIG. 1.

In the server device 1, for example, the server modules 2, the fans 3, the switch module 4, the chassis management module 5 and the power supply device 6 are placed in the location as described above. Herein, when the location of the server modules 2 is seen along the column, for example, the server module 2-3, the server module 2-6, the server module 2-9, the server module 2-12, the server module 2-14, the server module 2-16, the server module 2-18 and the server module 2-20 are placed in this order. Therefore, when seen along the column, the server modules 2-1 to 2-3 and the fans 3-1 to 3-2 are positioned on the opposite side to a side where the power supply device 6 and the fans 3-7 to 3-8 are positioned in the server device 1.

Further, the respective components are placed in the location relation as described above, and the server modules 2 form paths where the wind passes. Therefore, airflows caused by the rotating fans 3 pass, for example, as shown in FIG. 2. Referring to FIG. 2, the server modules 2-1 to 2-6 are positioned on airflows caused by rotation of the fans 3-2 and 3-1. The server device 1 in this exemplary embodiment executes temperature control (for example, cooling) on the server modules 2 by using the airflows caused by the rotating fans 3. Consequently, the abovementioned location relation represents that the server modules 2-1 to 2-6 are placed in positions where they can be cooled by the operation of the fans 3-2 and 3-1.

Further, referring to FIG. 2, the server modules 2-7 to 2-12 are positioned on airflows caused by rotation of the fans 3-4 and 3-3. Moreover, the server modules 2-13 to 2-16 and the switch module 4 are positioned on airflows caused by rotation of the fans 3-6 and 3-5. Moreover, the server modules 2-17 to 2-20, the chassis management module 5 and the power supply device 6 are positioned on airflows caused by rotation of the fans 3-8 and 3-7.

The switch module 4 is connected to each of the server modules 2 on the basis of the location of the server module 2. For example, the switch module 4 is connected to the server modules 2 via ports determined by the location of the server modules 2.

To be specific, the switch module 4 has cores 41-1 and 41-2 (expressed as the cores 41 when they are not distinguished from each other specifically) which control the ports, and is connected to the server modules 2 through the ports determined in accordance with the location of the server modules 2. For example, the switch module 4 is connected to the respective server modules 2 so that the server modules 2 placed in positions where they can be cooled by the single fan 3 are connected to the ports controlled by the single core 41.

For example, FIG. 3 shows the connection relation between the server modules 2 and the switch module 4, and shows that the server modules 2 and the cores 41 of the switch module 4 which are in the same pattern are connected. Referring to FIG. 3, the server modules 2-1 to 2-12 are connected to the ports controlled by the core 41-1 of the switch module 4. Moreover, the server modules 2-13 to 2-20 are connected to the ports controlled by the core 41-2 of the switch module 4.

That is to say, the server modules 2-1 to 2-6 placed in positions where they can be cooled by the fans 3-1 and 3-2 are connected to the ports controlled by the core 41-1. Also, the server modules 2-7 to 2-12 placed in positions where they can be cooled by the fans 3-3 and 3-4 are connected to the ports controlled by the core 41-1. On the other hand, the server modules 2-13 to 2-16 placed in positions where they can be cooled by the fans 3-5 and 3-6 are connected to the ports controlled by the core 41-2. Also, the server modules 2-17 to 2-20 placed in positions where they can be cooled by the fans 3-7 and 3-8 are connected to the ports controlled by the core 41-2. Thus, the server modules 2 are connected to the switch module 4 in accordance with the location of the server modules 2.

The chassis management module 5 (CMM) receives a use request for the server module 2 from the user. Then, in response to the received use request, the chassis management module 5 decides the server module 2 to run, and runs the decided server module 2. Moreover, the chassis management module 5 runs the fan 3 and controls the operation status of the switch module 4 when needed. After that, the chassis management module 5 transmits, to the user, information for accessing the server module 2 run thereby (for example, the MAC address (Media Access Control address) of a BMC (Baseboard Management Controller) which is installed in the server module 2 but is not illustrated.

Referring to FIG. 4, the chassis management module 5 has a transmission and reception unit 51, a control unit 52, location information 53, and temperature information 54. The chassis management module 5 has an arithmetic device and a storage device which are not illustrated, and the respective units are realized by execution of a program stored in the storage device by the arithmetic device. Moreover, the location information 53 and the temperature information 54 are stored in a storage device (not shown) of the chassis management module 5.

Further, the chassis management module 5 stores a high-temperature threshold as a first threshold and a low-temperature threshold as a second threshold in a storage device which is not illustrated. The high-temperature threshold and the low-temperature threshold are predetermined values, and the low-temperature threshold is smaller in value than the high-temperature threshold. The high-temperature threshold and the low-temperature threshold may be any values as far as the low-temperature threshold is smaller in value than the high-temperature threshold. The high-temperature threshold and the low-temperature threshold are used by the control unit 52 as described later.

The transmission and reception unit 51 receives a use request for the server module 2 from the user. Moreover, the transmission and reception unit 51 transmits information for accessing the server module 2 run by the control unit 52 to the user.

The control unit 52 decides the server module 2 to run on the basis of, for example, the result of measurement by the temperature measurement part 21. For example, the control unit 52 selects the server modules 2 with the result of measurement by the temperature measurement part 21 in a given range. Then, the control unit 52 decides the server module 2 to run from among the selected server modules 2 on the basis of the number of rotations of the fan 3 and the temperatures of the server modules 2.

For example, the control unit 52 selects the server module 2 with a temperature in a given range with reference to the temperature information 54. To be specific, with reference to the temperature information 54, the control unit 52 selects the server module 2 whose temperature measured by the temperature measurement part 21 is not more than the high-temperature threshold. Moreover, with reference to the temperature information 54, the control unit 52 selects the server module 2 whose temperature measured by the temperature measurement part 21 is more than the low-temperature threshold. Thus, by using the high-temperature threshold and the low-temperature threshold, the control unit 52 selects the server module 2 whose temperature is more than the low-temperature threshold and is not more than the high-temperature threshold.

In a case where there is not the server module 2 whose temperature belongs to the abovementioned given range, the control unit 52 selects, for example, the server module 2 whose temperature is close to the abovementioned temperature range (for example, a temperature in the given range ±5 degrees).

Subsequently, the control unit 52 decides the server module 2 to run from among the selected server modules 2 and runs the decided server module 2. For example, with reference to the location information 53 and the temperature information 54, the control unit 52 decides the server module 2 to run so that the numbers of rotations of the fans 3 and the temperatures of the server modules 2 become constant.

For example, after running the server module 2-1 positioned on airflows caused by the fans 3-2 and 3-1, the control unit 52 runs the server module 2-8 positioned on airflows caused by the fans 3-4 and 3-3. Thus, with reference to the location information 53, the control unit 52 distributes the positions of the server modules 2 to run so that the server module 2 positioned on an airflow caused by the same fan 3 does not successively run. In other words, the control unit 52 decides the server module 2 to run so that the number of the running server modules 2 among the server modules 2 that can be cooled by the fans 3 does not concentrate, that is, the numbers of rotations of the fans 3 become constant.

Further, for example, the control unit 52 runs the server module 2-5, and thereafter, runs the server module 2-12 which is not adjacent to the server module 2-2. Thus, with reference to the location information 53, the control unit 52 distributes the server modules 2 to run so that the server modules 2 adjacent to each other do not successively run. In other words, the control unit 52 refers to the location information 53 and distributes the positions of the server modules 2 to run so that the distribution of the running server modules 2 does not concentrate.

Further, for example, with reference to the temperature information 54, the control unit 52 runs the server modules 2 with temperatures in the abovementioned given range in order from the lower temperature. Thus, the control unit 52 selects the server module 2 to run so that the temperatures of the server modules 2 become uniform.

The control unit 52 decides the server module 2 to run so that the numbers of rotations of the fans 3 and the temperatures of the server modules 2 become constant, for example, by any of the methods described above or in combination of the methods. Meanwhile, the control unit 52 may decide the server module 2 to run so that the numbers of rotations of the fans 3 and the temperatures of the server modules 2 become constant by any method other than the methods described above.

Further, the control unit 52 determines on the basis of the location information 53 whether or not the fan 3 that can cool the server module 2 to newly run is in the running state. That is to say, the control unit 52 determines on the basis of the location information 53 whether or not the server module 2 to run is positioned on an air flow caused by the running fan 3. Then, in a case where the location of the server module 2 to newly run is not on an airflow caused by the already running fan 3, the control unit 52 runs the corresponding fan 3. On the other hand, in a case where the fan 3 that can cool the server module 2 to run is in the running state, the control unit 52 does not newly run the fan 3.

In a manner such that has been described above, the control unit 52 selects the server modules 2 with the results of measurement by the temperature measurement part 21 in a given range and, on the basis of the numbers of rotations of the fans 3 and the temperatures of the server modules 2, decides the server module 2 to run from among the selected server modules 2. Moreover, the control unit 52 runs the new fan 3 when needed.

Further, on the basis of the operation statuses of the server modules 2 placed in positions where they can be cooled by the respective fans 3, the control unit 52 controls the numbers of rotations of the fans 3. To be specific, the control unit 52 controls the numbers of rotations of the fans 3 in accordance with the number of the running server modules of the server modules 2 located in the positions where they can be cooled and the temperatures of the server modules 2. For example, the control unit 52 controls the number of rotations of the fan 3 so that the number of rotations of the fan 3 increases as the number of the running server modules 2 of the server modules 2 located on the airflow caused by rotation of the fan 3 increases. Also, for example, the control unit 52 controls the number of rotations of the fan 3 so that the number of rotations of the fan 3 increases as the temperature of the server module 2 located on the airflow caused by rotation of the fan 3 increases.

Further, the control unit 52 controls the operation status of the switch module 4 on the basis of the location of the server module 2 in the running state. For example, the control unit 52 controls the core 41 of the switch module 4 so that the port connected to the running server module 2 comes to the running state.

For example, let us assume a case where the fan 3-1, the fan 3-2, and the server module 2-1 are in the running state. In this case, the control unit 52 runs the core 41-1, but does not run the core 41-2. Moreover, for example, in the case of running the server module 2-13, the control unit 52 runs the core 41-2. Thus, the control unit 52 controls the operation status of the switch module 4 on the basis of the location of the server module 2 in the running state.

The location information 53 shows the location of the server modules 2 and the fans 3 placed in the server device 1. Moreover, the location information 53 includes information showing the server module 2 positioned on an airflow caused by operation of the fan 3. As described above, the location information 53 is used by the control unit 52.

FIG. 5 shows an example of the location information 53. As shown in FIG. 5, the location information 53 includes information showing the location of the fans 3 and the server modules 2. For example, in the case shown in FIG. 5, the location of the respective components is shown in the row direction. For example, the first row in FIG. 5 shows that the server module 2-1, the server module 2-2, the server module 2-3, the fan 3-1, and the fan 3-2 are associated. That is to say, it can be found from the first row in FIG. 5 that the server modules 2-1, 2-2 and 2-3 are placed on airflows caused by operation of the fans 3-1 and 3-2. Likewise, it can be found from the second row in FIG. 5 that the server modules 2-4, 2-5 and 2-6 are placed on airflows caused by operation of the fans 3-1 and 3-2.

Further, as shown in FIG. 5, the location information 53 can include information showing the connection relation between the server modules 2 and the cores 41 of the switch module 4. For example, on the first row in FIG. 5, the server modules 2-1, 2-2 and 2-3 are associated with the core 41-1 of the switch module 4. That is to say, it can be found from FIG. 5 that the server modules 2-1, 2-2 and 2-3 are connected to the core 41-1 of the switch module 4.

Further, the location information 53 can include information showing the location of the power supply device 6. For example, on the seventh row in FIG. 5, the fan 3-7, the fan 3-8, the server module 2-17, the server module 2-18, and the switch module 41-2 are associated with information showing the location of the power supply device 6. That is to say, it can be found from FIG. 5 that the power supply device 6 is placed on an airflow caused by operation of the fans 3-7 and 3-8. Moreover, as described above, the location of the respective components is shown in the row direction. Therefore, referring to FIG. 5, it can be found that a side on which the fans 3-1 and 3-2 are positioned is opposite to a side on which the power supply device 6 is positioned.

The location information 53 may include, in addition to the information showing the location of the server modules 2 and the fans 3, information showing whether or not each of the server modules 2 and the fans 3 is in the running state.

The temperature information 54 shows a measurement result obtained in measurement by each of the temperature measurement parts 21 of the respective server modules 2. The temperature information 54 has a form associating the server module 2 with the temperature of the server module 2. The temperature information 54 is updated when the chassis management module 5 receives the measurement result from each of the temperature measurement parts 21. As described above, the temperature information 54 is used by the control unit 52. The temperature information 54 may be included by the location information 53.

The power supply device 6 is connected to an external power supply and is also connected to the server modules 2, the fans 3, the switch module 4, and the chassis management module 5. The power supply device 6 is supplied with power by the external power supply and supplies power to the server modules 2, the fans 3, the switch module 4, and the chassis management module 5.

The above is the description of the example of the configuration of the server device 1.

Next, an example of the configuration of the server device 1 will be described with reference to FIGS. 6 to 8.

Referring to FIG. 6, the transmission and reception unit 51 of the chassis management module 5 receives a use request for the server module 2 from the user (step S101). Then, the transmission and reception unit 51 transmits reception of the use request to the control unit 52.

In response to the received use request, the control unit 52 decides the server module 2 to run and runs the decided server module 2. The control unit 52 also controls the fans 3 and the switch module 4 when needed. Thus, on the basis of the received use request, the control unit 52 executes running control of the server modules 2 and so on (step S102).

After that, the chassis management module 5 transmits information for accessing the server module 2 caused to run to the user (step S103).

An example of the operation of the server device 1 has been described above. Next, an example of a detailed flow of the running control at step S102 will be described with reference to FIG. 7.

Referring to FIG. 7, the control unit 52 checks whether or not there are the server modules 2 having been unused (step S201).

In a case where there are the unused server modules 2 (step S201, Yes), the control unit 52 selects the server module 2 satisfying a given condition and decides the server module 2 to run (step S202). On the other hand, in a case where there is not the unused server module 2 (step S201, No), the control unit 52 selects the server module 2 to allocate next from among the running server modules 2 and allocates the selected server module 2 (step S203). Meanwhile, a detailed flow of deciding the server module 2 to run at step S202 will be described later.

Next, with reference to the location information 53, the control unit 52 checks whether or not the location of the server module 2 caused to run is on an airflow caused by rotation of the running fan 3 (step S204). In a case where the location of the server module 2 caused to run is not on an airflow caused by rotation of the running fan 3 (step S204, No), the control unit 52 runs the fan 3 corresponding to the location of the server module 2 caused to run (step S205). On the other hand, in a case where the location of the server module 2 caused to run is on the airflow caused by rotation of the running fan 3 (step S204, Yes), the control unit 52 does not execute control to newly run the fan 3.

Subsequently, the control unit 52 controls the number of rotations of the fan 3 in accordance with the number of the running server modules 2 of the server modules 2 placed in positions where they can be cooled (step S206). For example, the control unit 52 controls the number of rotations of the fan 3 so that the number of rotations of the fan 3 increases as the number of the running server modules 2 of the server modules 2 placed on an airflow caused by rotation of the fan 3 increases.

Further, the control unit 52 checks whether or not the server module 2 caused to run is connected to the port of the core 41 of the running switch module 4 (step S207). In a case where the server module 2 caused to run is connected to the port of the core 41 of the running switch module 4 (step S207, Yes), the control unit 52 instructs the core 41 of the switch module 4 to enable (run) the corresponding port (step S208). On the other hand, in a case where the server module 2 caused to run is not connected to the port of the core 41 of the running switch module 4 (step S207, No), the control unit 52 runs the corresponding core 41 and enables the corresponding port (step S209).

An example of the detailed flow of the running control at the step S102 has been described above. Next, an example of the detailed flow of step S202 will be described with reference to FIG. 8.

Referring to FIG. 8, the control unit 52 checks whether or not there is the server module 2 with temperature in a given range (step S301). In a case where there is the server module 2 with temperature in the given range (step S301, Yes), the control unit 52 selects the server module 2 satisfying the condition (with temperature in the given range) (step S302). On the other hand, in a case where there is not the server module 2 with temperature in the given range (step S301, No), the control unit 52 selects the server module 2 in a state close to the condition (step S303).

Subsequently, the control unit 52 decides the server module 2 to run from among the selected server modules 2 on the basis of the numbers of rotations of the fans 3 and the temperatures of the server modules 2 (step S304). For example, the control unit 52 decides the server module 2 to run so that the numbers of rotations of the fans 3 and the temperatures of the server modules 2 become constant, with reference to the location information 53 and the temperature information 54. Then, the control unit 52 runs the decided server module 2.

The above is an example of the detailed flow of step S202.

Thus, in the server device 1 of this exemplary embodiment, each of the server modules 2 has the temperature measurement part 21. Moreover, the server device 1 has the chassis management module 5 having the control unit 52 and the temperature information 54. Such a configuration allows the control unit 52 to decide the server module 2 to run on the basis of the temperature information 54 showing the result of measurement by the temperature measurement part 21. As a result, the control unit 52 can, for example, run the server module 2 with the result of measurement by the temperature measurement unit 21 in a given range. That is to say, for example, the control unit 52 can control so that the server module 2 does not run in a high-temperature range where the life decreases or a low-temperature range which may cause a fault. As a result, it becomes possible to prevent the life from decreasing, and it becomes possible to extend the life of the server device 1.

Further, the control unit 52 in this exemplary embodiment is configured to decide the server module 2 to run so that the numbers of rotations of the fans 3 and the temperatures of the server modules 2 become constant. There is a fear that frequent change of the number of rotations of the fan 3 and extreme change of the temperature of the server module 2 cause failures. Therefore, execution of control by the control unit 52 as described above allows prevention of control that may cause a failure and consequently allows extension of the life of the server device 1.

Further, the server device 1 in this exemplary embodiment controls the number of rotations of the fan 3 in accordance with the number of the running server modules 2 of the server modules 2 placed in positions where they can be cooled. Consequently, it is possible to, for example, prevent the fan 3 from being rotated as much as unnecessarily for cooling.

Further, the control unit 52 can be configured to run the server modules 2 whose temperatures are in the given range described above in order from the lower temperature. Such a configuration can limit the increase of the temperature of the server module 2 more effectively. As a result, it is possible to prevent a failure.

The location of the server modules 2, the fans 3, the switch module 4, the chassis management module 5 and the power supply device 6 in the server device 1 described in this exemplary embodiment is just an example. In the server device 1, the server modules 2, the fans 3, the switch module 4, the chassis management module 5 and the power supply device 6 may be placed in positions other than those described in this exemplary embodiment. Thus, the present invention can be applied without any problem to any server device 1 other than the server device 1 with the location as shown in FIG. 1. Moreover, the numbers of the server modules 2, the fans 3, the switch modules 4, the chassis management modules 5 and the power supply devices 6 are not limited to those described in this exemplary embodiment.

Further, the connection relation between the server modules 2 and the cores 41 of the switch module 4 is not limited to that described in this exemplary embodiment. The server modules 2 and the cores 4 may be in any connection relation other than the connection relation described in this exemplary embodiment as far as the connection relation is one based on the location of the server modules 2. The server modules 2 and the switch module 4 may be, for example, in a connection relation as shown in FIG. 9. For example, referring to FIG. 9, the server module 2-1, the server module 2-2 and the server module 2-3 are connected to the core 41-1, and the server module 2-4, the server module 2-5 and the server module 2-6 are connected to the core 41-2. Thus, the server modules 2 placed in positions where they can be cooled by the single fan 3 may be connected to the ports controlled by the plurality of cores 41.

Further, in this exemplary embodiment, the server module 2 has the temperature measurement part 21. However, a site to measure temperature is not limited to the server module 2. The server device 1 may be configured to measure the outside temperature, the intake-air temperature or the temperature of the power supply device 6 or the like and decide the server module 2 to run in consideration of the measurement result. For example, the server device 1 can be configured to, in a case where the outside temperature or the intake-air temperature is more than a given outside temperature threshold, decide the server module 2 to newly run by using the result of measurement by the temperature measurement part 21. Moreover, the server device 1 can be configured to, for example, decide the server module 2 to newly run so as to run as least as possible the server module 2 around the power supply device 6 serving as a large heat source.

Second Exemplary Embodiment

Next, with reference to FIG. 10, a second exemplary embodiment of the present invention will be described. In this exemplary embodiment, the summary of the configuration of a server device 7 having a plurality of server modules 71 and a plurality of cooling fans 72 in a chassis will be described.

Figure 10:
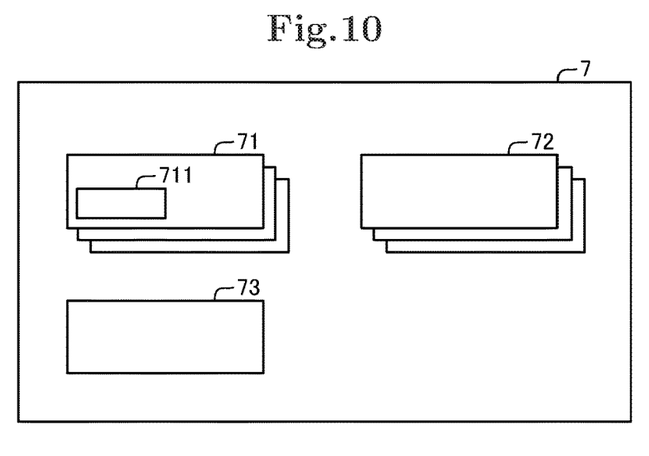
FIG. 10 is a schematic block diagram showing an example of the configuration of a server device according to a second exemplary embodiment of the present invention.

Referring to FIG. 10, the server device 7 has the server modules 71, the cooling fans 72, and a management unit 73. Each of the server modules 71 has a temperature measurement part 711.

The temperature measurement part 711 measures the temperature of the server module 71.

The management unit 73 controls the server modules 71. The management unit 73 decides the server module 71 to run on the basis of the result of measurement by the temperature measurement part 711.

Thus, in the server device 7 in this exemplary embodiment, each of the server modules 71 has the temperature measurement part 711. Moreover, the server device has the management unit 73. Such a configuration allows the management unit 73 to decide the server module 2 to run on the basis of the result of measurement by the temperature measurement part 711. As a result, the management unit 73 can, for example, run the server module 2 with the result of measurement by the temperature measurement part 711 in a given range. Thus, it becomes possible to prevent operation in a temperature range leading to decrease of the life, and it becomes possible to extend the life of the server device 1.

The server device 7 can be realized by installation of a given program into the server device 7. To be specific, a program as another aspect of the present invention is a program including instructions for causing a server device to realize a management unit and a temperature measurement unit. The server device has a plurality of server modules and a plurality of cooling fans in a chassis. The management unit controls the server modules and the cooling fans. The temperature measurement part measures the temperatures of the server modules. The management unit decides the server module to run on the basis of the result of measurement by the temperature measurement part.

Further, a server control method executed by operation of the server device 7 is a server control method executed by a server device having a plurality of server modules and a plurality of cooling fans in a chassis. The method includes measuring the temperatures of the server modules and deciding the server module to run on the basis of the result of measurement.

The inventions of a program and a server control method with the configurations described above have the same actions as the server device 7 and therefore can achieve the abovementioned object of the present invention.

Supplementary Notes

The whole or part of the exemplary embodiments disclosed above can be described as the following supplementary notes. Below, the overview of a server device and so on according to the present invention will be described. However, the present invention is not limited to the following configurations.

(Supplementary Note 1)

A server device having a plurality of server modules and a plurality of cooling fans in a chassis, the server device comprising:

a management unit configured to control the server modules; and a temperature measurement part configured to perform measurement of temperatures of the server modules, wherein the management unit is configured to decide a server module to run on a basis of a result of the measurement by the temperature measurement part.

(Supplementary Note 2)

The server device according to Supplementary Note 1, wherein the management unit is configured to decide, as the server module to run, on a server module on which the result of the measurement by the temperature measurement part is within a given range.

(Supplementary Note 3)

The server device according to Supplementary Note 1 or 2, wherein the management unit is configured to decide, as the server module to run, on a server module on which the result of the measurement by the temperature measurement part is not more than a predetermined first threshold.

(Supplementary Note 4)

The server device according to Supplementary Note 3, wherein the management unit is configured to decide, as the server module to run, on a server module on which the result of the measurement by the temperature measurement part is more than a second threshold, the second threshold being a smaller value than the first threshold.

(Supplementary Note 5)

The server device according to any of Supplementary Notes 1 to 4, wherein the management unit is configured to control numbers of rotations of the cooling fans and decide the server module to run so that a number of rotations of each of the cooling fans becomes constant.

(Supplementary Note 6)

The server device according to Supplementary Note 5, wherein the management unit has location information showing location of the server modules and the cooling fans and is configured to decide the server module to run so that the numbers of rotations of the cooling fans become constant on a basis of the location information.

(Supplementary Note 7)

The server device according to any of Supplementary Notes 1 to 6, wherein the management unit is configured to decide the server module to run so that the result of the measurement by the temperature measurement part included by each of the server modules becomes constant.

(Supplementary Note 8)

The server device according to Supplementary Note 7, wherein the management unit has location information showing location of the server modules and the cooling fans and is configured to decide the server module to run so that the result of the measurement by the temperature measurement part included by each of the server modules becomes constant on a basis of the location information.

(Supplementary Note 9)

A server control method executed by a server device having a plurality of server modules and a plurality of cooling fans in a chassis, the server control method comprising:

performing measurement of temperatures of the server modules and deciding a server module to run on a basis of a result of the measurement.

(Supplementary Note 9-1)

The server control method according to Supplementary Note 9, comprising:

deciding on a server module on which the result of the measurement of a temperature of the server module is within a given range, as the server module to run.

(Supplementary Note 9-2)

The server control method according to Supplementary Note 9 or 9-1, comprising: deciding, as the server module to run, on a server module on which the result of the measurement of a temperature of the server module is not more than a predetermined first threshold.

(Supplementary Note 10)

A program comprising instructions for causing a server device to realize a management unit, the server device having a plurality of server modules and a plurality of cooling fans in a chassis and also having a temperature measurement part configured to perform measurement of temperatures of the server modules, the management unit being configured to control the server modules, wherein the management unit is configured to decide a server module to run on a basis of a result of the measurement by the temperature measurement part.

(Supplementary Note 10-1)

The program according to Supplementary Note 10, wherein the management unit is configured to decide, as the server module to run, on a server module on which the result of the measurement by the temperature measurement part is within a given range.

(Supplementary Note 10-2)

The program according to Supplementary Note 10 or 10-1, wherein the management unit is configured to decide, as the server module to run, on a server module on which the result of the measurement by the temperature measurement part is not more than a predetermined first threshold.

(Supplementary Note 11)

A non-transitory computer-readable medium storing a program comprising instructions for causing a server device to realize a management unit, the server device having a plurality of server modules and a plurality of cooling fans in a chassis and also having a temperature measurement part configured to perform measurement of temperatures of the server modules, the management unit being configured to control the server modules, wherein the management unit is configured to decide a server module to run on a basis of a result of the measurement by the temperature measurement part.

(Supplementary Note 11-1)

The non-transitory computer-readable medium storing the program according to Supplementary Note 11, wherein the management unit is configured to decide, as the server module to run, on a server module on which the result of the measurement by the temperature measurement part is within a given range.

(Supplementary Note 11-2)

The non-transitory computer-readable medium storing the program according to Supplementary Note 11 or 11-1, wherein the management unit is configured to decide, as the server module to run, on a server module on which the result of the measurement by the temperature measurement part is not more than a predetermined first threshold.

The program described in the exemplary embodiments and supplementary notes is stored in a storage device or recorded on a computer-readable recording medium. For example, the recording medium is a portable medium such as a flexible disk, an optical disk, a magneto-optical disk, and a semiconductor memory.

Although the present invention is described above with reference to the exemplary embodiments, the present invention is not limited to the exemplary embodiments. The configurations and details of the present invention can be changed in various manners that can be understood by one skilled in the art within the scope of the present invention.

DESCRIPTION OF NUMERALS 1 server device
2 server module
21 temperature measurement part
3 fan 4 switch module
41 core
5 chassis management module
51 transmission and reception unit
52 control unit
53 location information
54 temperature information
6 power supply device
7 server device
71 server module
711 temperature measurement part
72 cooling fan
73 management unit

The invention claimed is:

1. A server device having a plurality of server modules and a plurality of cooling fans in a chassis, the server device comprising:
   a management unit configured to control the server modules; and
   a temperature measurement part configured to perform measurement of temperatures of the server modules,
   wherein the management unit is configured to decide a server module to run based on a result of the measurement by the temperature measurement part,
   wherein the management unit is configured to decide that the server module to run is a server module that has a result of the measurement by the temperature measurement part that is not more than a predetermined first threshold, and
   wherein the management unit is configured to decide that the server module to run is a server module that has a result of the measurement by the temperature measurement part that is more than a second threshold, the second threshold being a smaller value than the first threshold.

2. The server device according to claim 1, wherein the management unit is configured to decide that the server module to run is a server module that has a result of the measurement by the temperature measurement part that is within a given range.

3. The server device according to claim 1, wherein the management unit is configured to control numbers of rotations of the cooling fans and decide the server module to run so that a number of rotations of each of the cooling fans becomes constant.

4. The server device according to claim 3, wherein the management unit has location information showing location of the server modules and the cooling fans and is configured to decide the server module to run so that the number of rotations of each of the cooling fans become constant on a basis of the location information.

5. The server device according to claim 1, wherein the management unit is configured to decide the server module to run so that the result of the measurement by the temperature measurement part included by each of the server modules becomes constant.

6. The server device according to claim 5, wherein the management unit has location information showing location of the server modules and the cooling fans and is configured to decide the server module to run so that the result of the measurement by the temperature measurement part included by each of the server modules becomes constant on a basis of the location information.

7. A server control method executed by a server device having a plurality of server modules and a plurality of cooling fans in a chassis, the server control method comprising:
   performing measurement of temperatures of the server modules and deciding a server module to run on a basis of a result of the measurement,
   wherein the deciding of the server module to run includes deciding that the server module to run is a server module that has a result of the measurement by the temperature measurement part that is not more than a predetermined first threshold, and
   wherein the deciding of the server module to run includes deciding that the server module to run is a server module that has a result of the measurement by the temperature measurement part that is more than a second threshold, the second threshold being a smaller value than the first threshold.

8. A non-transitory computer-readable medium storing a program comprising instructions for causing a server device to realize a management unit, the server device having a plurality of server modules and a plurality of cooling fans in a chassis and also having a temperature measurement part configured to perform measurement of temperatures of the server modules, the management unit being configured to control the server modules,
   wherein the management unit is configured to decide a server module to run on a basis of a result of the measurement by the temperature measurement part,
   wherein the management unit is configured to decide that the server module to run is a server module that has a result of the measurement by the temperature measurement part that is not more than a predetermined first threshold, and
   wherein the management unit is configured to decide that the server module to run is a server module that has a result of the measurement by the temperature measurement part that is more than a second threshold, the second threshold being a smaller value than the first threshold.

* * * * *